United States Patent
Kumar et al.

(10) Patent No.: US 7,241,681 B2
(45) Date of Patent: Jul. 10, 2007

(54) BILAYERED METAL HARDMASKS FOR USE IN DUAL DAMASCENE ETCH SCHEMES

(75) Inventors: Kaushik Kumar, Beacon, NY (US); Lawrence Clevenger, LaGrangeville, NY (US); Timothy Dalton, Ridgefield, CT (US); Douglas C. La Tulipe, Danbury, CT (US); Andy Cowley, Wappingers Falls, NY (US); Erdem Kaltalioglu, Hsin-Chu (TW); Jochen Schacht, Hsin-Chu (TW); Andrew H. Simon, Fishkill, NY (US); Mark Hoinkis, Fishkill, NY (US); Steffen K. Kaldor, Fishkill, NY (US); Chih-Chao Yang, Beacon, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/330,834

(22) Filed: Jan. 12, 2006

(65) Prior Publication Data

US 2006/0113278 A1 Jun. 1, 2006

Related U.S. Application Data

(62) Division of application No. 10/461,090, filed on Jun. 13, 2003, now Pat. No. 7,052,621.

(51) Int. Cl.
*H01L 21/4763* (2006.01)
(52) U.S. Cl. .............. 438/618; 438/622; 438/623; 438/624; 438/625

(58) Field of Classification Search .............. None
See application file for complete search history.

(56) References Cited

U.S. PATENT DOCUMENTS

| | | | |
|---|---|---|---|
| 6,150,073 A | 11/2000 | Huang | |
| 6,211,061 B1 | 4/2001 | Chen et al. | |
| 6,331,479 B1 | 12/2001 | Li et al. | |
| 6,410,424 B1 | 6/2002 | Tsai et al. | |
| 6,509,267 B1 | 1/2003 | Woo et al. | |
| 6,638,871 B2 | 10/2003 | Wang et al. | |
| 6,696,222 B2 | 2/2004 | Hsue et al. | |
| 2003/0022110 A1 | 1/2003 | Huang | |
| 2003/0044725 A1 | 3/2003 | Hsue et al. | |
| 2004/0147112 A1* | 7/2004 | Tsu et al. ............... | 438/637 |

OTHER PUBLICATIONS

Wolf, S., "Silicon Processing For The VLSI Era," vol. 4: Deep-Submicron Process Technology, Lattice Press, 2002, pp. 682, 683, 711, 723-726.

Xu, P., et al., "BLOK™—A Low-k Dielectric Barrier/Etch Stop Film for Copper Damascene Applications," IEEE, 1999, pp. 109-111.

* cited by examiner

*Primary Examiner*—Duy-Vu N. Deo
(74) *Attorney, Agent, or Firm*—Slater & Matsil, L.L.P.

(57) ABSTRACT

A metal hardmask for use with a Dual Damascene process used in the manufacturing of semiconductor devices. The metal hardmask has advantageous translucent characteristics to facilitate alignment between levels while fabricating a semiconductor device and avoids the formation of metal oxide residue deposits. The metal hardmask comprises a first or primary layer of TiN (titanium nitride) and a second or capping layer of TaN (tantalum nitride).

8 Claims, 5 Drawing Sheets

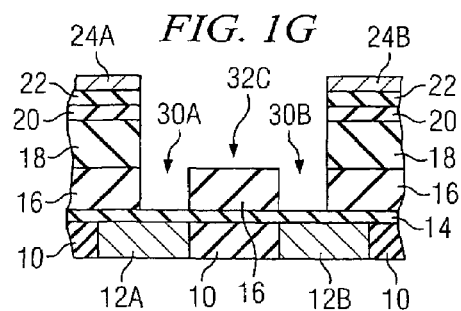
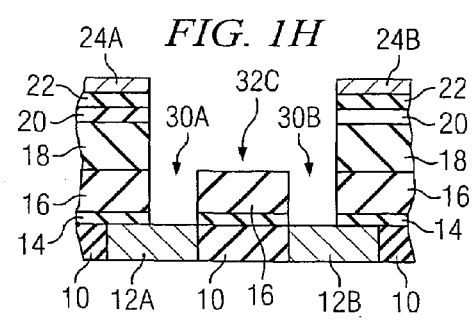
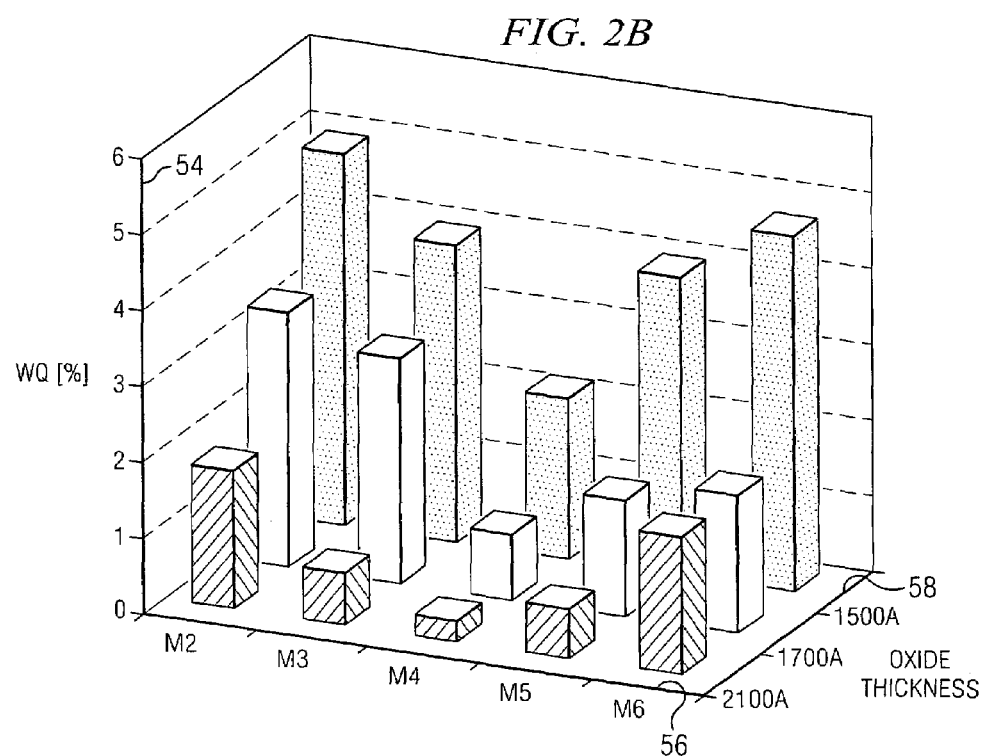

BILAYERED METAL HARDMASKS FOR USE IN DUAL DAMASCENE ETCH SCHEMES

This application is a divisional of patent application Ser. No. 10/461,090, entitled "Bilayered Metal Hardmasks For Use In Dual Damascene Etch Schemes," filed on Jun. 13, 2003, now U.S. Pat. No. 7,052,621, which application is incorporated herein by reference.

TECHNICAL FIELD

The present invention relates generally to a the use of a metal hardmask in a dual damascene etch scheme, and more particularly to the use of a metal hardmask comprised of two different metal compounds, TiN (titanium nitride) and TaN (tantalum nitride) to avoid both lithography alignment problems and metal oxide residue deposits on the wafer surface.

BACKGROUND

As is well known by those skilled in the art, a continuing goal in manufacturing and production of semiconductors is a reduction in size of components and circuits with the concurrent result of an increase in the number of circuits and/or circuit elements such as transistors, capacitors, etc., on a single semiconductor device. This relentless and successful reduction in size of the circuit elements has also required reduction in the size of the conductive lines connecting devices and circuits. However, as the conducting lines are designed to be smaller and smaller, the resistance of the interconnects increases. Further, as the number of dielectric layers increases, the capacitive coupling between lines on the same level and adjacent level increases.

In the past, aluminum was used as the metal interconnect lines and silicon oxide as the dielectric. However, newer manufacturing techniques now favor copper as the metal for interconnect lines and various low K materials (organic and inorganic) are favored as the dielectric material. Not surprisingly, these material changes have required changes in the processing methods. In particular, because of the difficulty of etching copper without also causing unacceptable damage to the dielectric material, the technique of forming the metal interconnect lines has experienced significant changes. Namely, whereas aluminum interconnects could be formed by depositing a layer of aluminum and then using photoresist, lithography, and etching to leave a desired pattern of aluminum lines, the formation of copper interconnect lines are typically formed by a process now commonly referred to as a Damascene process. The Damascene process is almost the reverse of etching, and simply stated a trench, canal or via is cut, etched or otherwise formed in the underlying dielectric and is then filled with metal (i.e., copper).

The process is rather straightforward if the metallization or copper layer was to be formed at only one level. However, as is well known by those skilled in the art, semiconductor devices are now formed at multiple levels on a chip and consequently metallization or interconnects, which are on the order of 100 nm (nanometers) and less, must also be formed at each level. Further, not only are multiple levels of metallization required, but these multiple levels must be interconnected. The possibility of difficulty in achieving the necessary registration of 100 nm connecting vias through the dielectric (which will then be filled with copper) that will align with a 100 nm interconnect line at another level in the same semiconductor device becomes apparent.

To facilitate alignment and registration, one approach has been the use of titanium nitride, TiN, as a metal hardmask for etching the trenches and inter-level connecting vias. The TiN is sufficiently translucent to wavelengths of light used by the lithography process such that alignment does not pose a difficult problem. Unfortunately, because of the presence of oxygen during an RIE (reactive ion etch) process used to cut the vias, the titanium in the metal compound leaves a $TiO_x$ based residue on the etched surfaces. The $TiO_x$ can increase capacitance and affect the reliability and yield of the process.

It is also been found that the use of TaN as a metal hardmask does not result in the formation of metal oxide residue such as occurs when TiN is used. However, TaN doesn't have the translucent characteristics of TiN and presents problems in aligning the template pattern with lower metal levels, especially aligning level M3 with level M4.

Therefore, a metal hardmask having satisfactory translucent characteristics to avoid alignment problems and that did not leave a metal oxide residue on the etched surface would be advantageous.

SUMMARY OF THE INVENTION

These and other problems are generally solved or circumvented, and technical advantages are generally achieved, by the present invention which provides a metal hardmask and a method of forming such a hardmask to provide a template for patterning a dielectric stack for use with a Damascene process for forming copper interconnects. The hardmask comprises a patterned layer of TiN (titanium nitride) having a thickness of between about 20 nm and 25 nm covering a dielectric stack, which in turn is covered by a capping layer of TaN (tantalum nitride) having a thickness of between about 7.5 nm and 10 nm. A typical dielectric stack may include a layer of organic resin such as SiLK™ which is an aromatic polymer available from the Dow Chemical Company. Another dielectric used in the stack is typically silicon dioxide.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1A through FIG. 1H illustrates a typical prior art Dual Damascene process;

FIG. 2B is a diagram illustrating how the alignment problem varies between different multi-level layers;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Referring now to FIGS. 1A through 1H, there is illustrated a typical Dual Damascene or DD etch scheme starting with a patterned metal hardmask through punch-through or contact with a lower level of metallization.

Figure 1A:
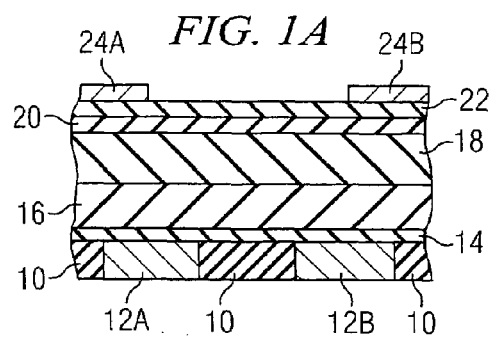

As shown in FIG. 1A there is an organic dielectric layer 10 which includes previously deposited metal areas or interconnect lines 12a and 12b such as may be deposited by a Damascene process. On top of the layer of organic dielectric 10 and metallization interconnection 12a and 12b there is a stop-etch layer 14 such as a $SiN_2$ (silicon nitride) stop-etch layer. The $SiN_2$ or stop-etch layer 14 is typically deposited over the surface of the dielectric layer 10 and metallization after the metal at 12a and 12b has been chemically milled. On top of the stop-etch layer a layer of a first dielectric material such as a silicon oxide ($SiO_2$) material 16 is deposited to a thickness of between 0.1 and 0.30 µm covered by a second organic dielectric layer 18 having a thickness of between about 0.1 and 0.5 µm such as the organic dielectric layer 10 discussed above. A suitable organic material for dielectric layers 10 and/or 18 is an aromatic polymer having the trade name SiLK™ available from the Dow Chemical Company. The organic or SiLK™ layer 18 is then typically covered by an etch stop film layer 20. A particularly effective etch stop film material for use as a copper barrier and with a low dielectric constant is a layer of BLoK™ available from the Applied Materials Company and having a thickness of between about 50 nm and 70 nm. In addition to the BloK™ layer 20, a SiN etch stop layer 22 having a thickness of about 35 nm to about 50 nm will also typically be included if the stack is to be subjected to a copper Dual Damascene process. A metal layer having a thickness of between about 0.005 µm and 0.05 µm will also have been deposited and patterned by a standard photoresist process to form a metal hardmask such as the metal hardmask portions 24a and 24b.

Figure 1B:
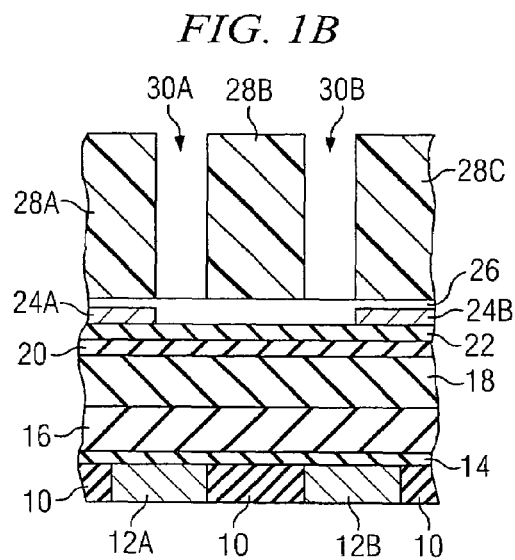
Figure 1C:
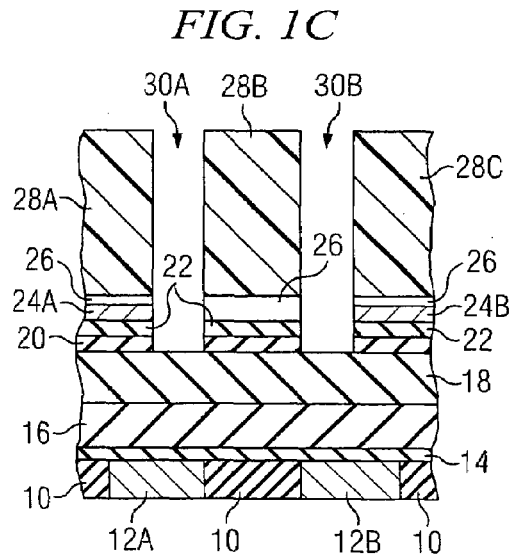
Figure 1D:
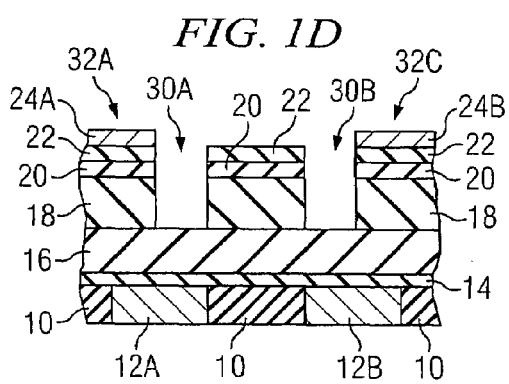
Figure 1E:
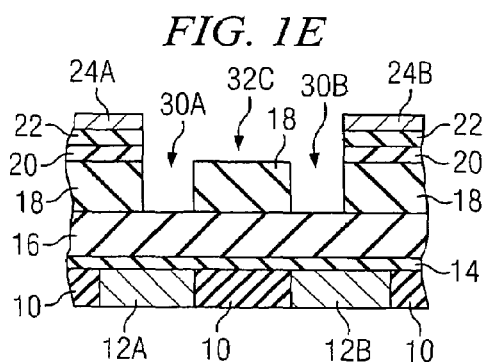

After the metal hardmask as represented by portions 24a and 24b has been formed, it is then typically covered by an antireflective coating (ARC) 26 prior to depositing a photoresist layer, which, as indicated in FIG. 1B, has been patterned to include patterns or portions 28a, 28b and 28c as defined by vias 30a and 30b. Then, as shown in FIG. 1C, the dielectric stack on top of the organic dielectric layer 10 with the metallization interconnect portions 12a and 12b is then subjected to an etch process to etch or extend vias 30a and 30b through the ARC layer 26, the SiN layer 22 and the BLoK™ layer 20 to the organic dielectric or SiLK™ layer 18. After the SiN layer 22 and BLoK™ layer 20 have been removed, the vias 30a and 30b are now extended through or etched through the SiLK™ layer 18 as shown in FIG. 1D. Also as shown in FIG. 1D, the remainder of the photoresist mask 28a, 28b and 28c and the ARC layer 26 not removed during the via etching is removed. As shown in FIG. 1D, the narrow left hand stack 32a and the narrow right hand stack 32b as formed by vias 30a and 30b still include the metal hardmask portions 24a and 24b. The middle stack 32c on the other hand does not include a hardmask portion and the topmost layer is the SiN layer 22. Thus, the "trough" of the Damascene process is ready to be opened (i.e., the SiLK™ layer 18 can be made ready for etching) by using another etch to remove the SiN layer 22 and the BLoK™ layer 20 of the center stack 32c that is selective to and therefore will not etch the metal hardmask portions 24a and 24b as indicated at FIG. 1E. Thus, after the center portion 32c of the SiN layer 22 and the BLoK™ layer 20 have been etched or removed, the organic layer 18 (e.g., the SiLK™ layer) is now exposed as shown in FIG. 1E.

Figure 1F:
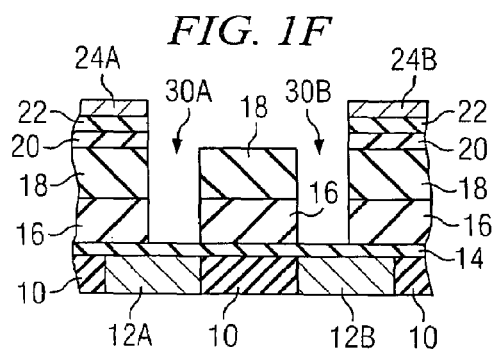

Then, as shown in FIG. 1F, the vias 30a and 30b, which have already been etched through the SiLK™ layer 18 are extended by an etch through the oxide (SiO) layer 16 such that vias 30a and 30b now extend to the SiN or etch-stop layer 14. The "trough" to be used by the Dual Damascene process is then formed as indicated in FIG. 1G by removal of the center portion 34 of the SiLK™ layer 18 as shown in FIG. 1G. Finally, the finish etch is completed as it punches through or etches through the SiN layer 14 to expose the two metallic lines 12a and 12b typically made of copper as indicated in FIG. 1H. After the metallic lines 12a and 12b are exposed, the vias 30a and 30b and trough area are now filled with copper to complete the Dual Damascene process. Filling the vias and trough with copper is typically accomplished by a first PVD (physical vapor deposition) process for seeding the copper and then an ECD (electrochemical deposition) process for filling the vias and the trench or trough.

Figure 2A:
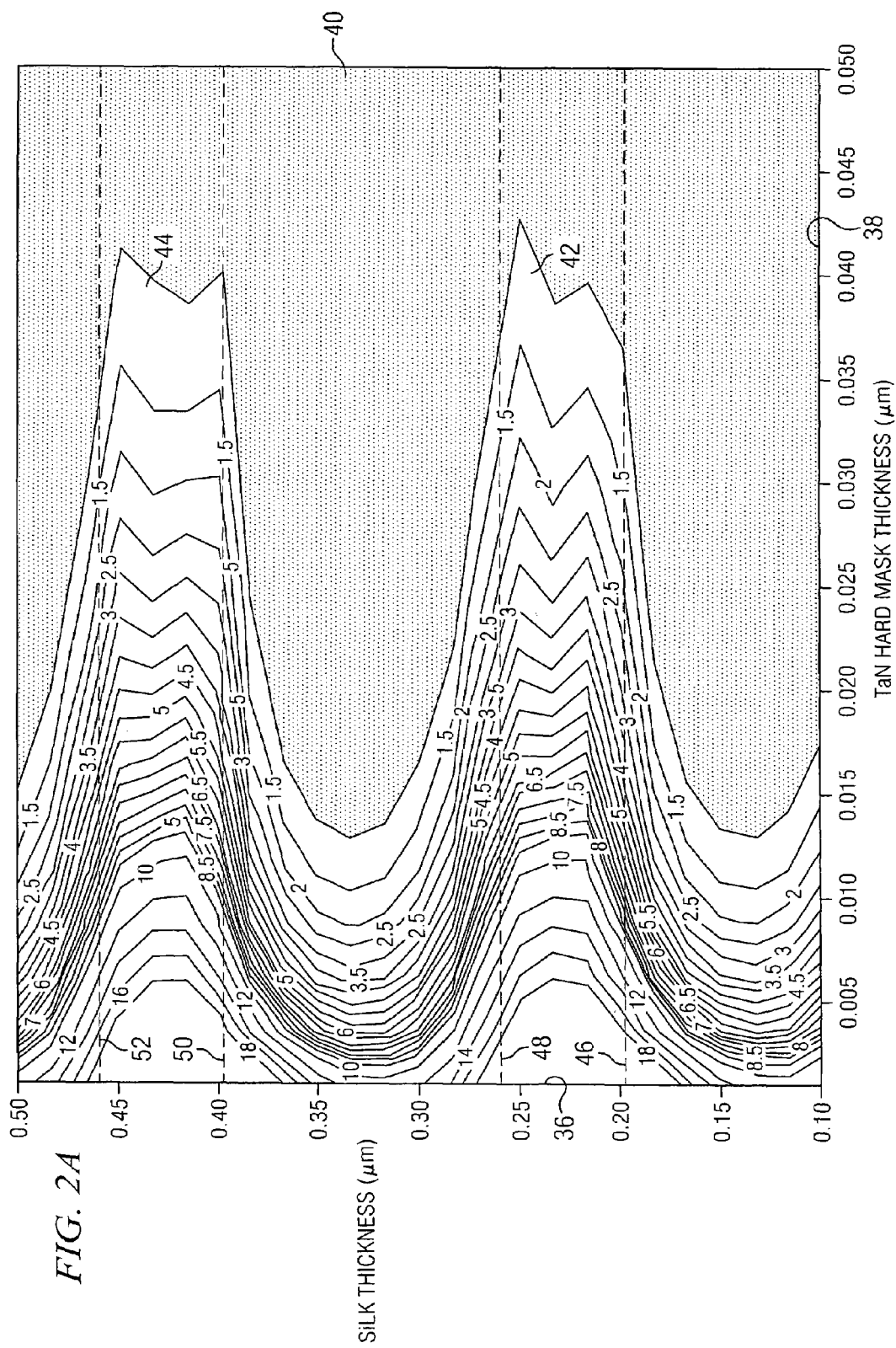
FIG. 2A is a diagram illustrating alignment problems resulting from the use of TaN as the metal hardmask and an organic dielectric such as SiLK™. The diagram illustrates the effects of different thicknesses of TaN layers and SiLK™ layers on the alignment problem.

Referring now to FIG. 2A, there is a diagram or chart illustrating the effects that changes in thickness have on lithography alignment when the metal layer 24 (to be patterned as a hardmask covering the organic dielectric layer of SiLK™ layer) is TaN. As shown, the vertical axis 36 represents the thickness of the organic layer and the horizontal axis 38 represents the thickness of the TaN metal layer. The contour lines represents the WQ (wafer quality) and the shaded area 40 represents those combinations of thicknesses of the SiLK™ layer and TaN layers where the alignment is unreliable. That is, the WQ is less than 1. Since the unreliability alignment area (i.e., shaded area) 40 covers about one half of the graph, the possibility of alignment problems become apparent.

It is noted that for certain SiLK™ thicknesses (such as at about 0.25 µm and at about 0.45 µm) the TaN layer may be substantially thicker (for example over about 0.035 µm) and still result in reliable alignment so as to produce WQ greater than 1 as indicated by rightward extending horizontal peaks 42 and 44. More specifically, as can be seen from FIG. 2A, if the SiLK™ layer is selected to be between about 0.2 µm and about 0.26 µm (as indicated by dotted lines 46 and 48) or alternatively selected to be between about 0.4 µm and 0.46 µm (as indicated by dotted lines 50 and 52) the thickness of a TaN hardmask can vary over a significant range. On the other hand, SiLK™ thicknesses of about 0.125 µm and about 0.34 µm will result in unreliable alignment even when the TaN layer is less than 0.015 μm. This phenomenon is believed to be caused by lithographic light reflections interfering with the primary lithographic light beam.

Further, referring to FIG. 2B it is seen that even when a favorable SiLK™ thickness such as 0.22 μm is selected, alignment may still be unreliable depending upon the thickness of the oxide ($SiO_2$) dielectric layer 16 and the levels of the metallization on the device. As shown, FIG. 2B again illustrates WQ as shown along the Y axis 54, the metallization level shown along the X axis 56 and the oxide ($SiO_2$) along the Z axis 58. Not surprisingly, the WQ decreases as the oxide thickness increases. However, the alignment between metallization levels M3/M4 and M4/M5 is still unacceptable due to interference between the primary and reflected lithographic light beams.

Therefore, analysis and review of the unreliable alignment resulting from thickness variations between the organic dielectric layer 18 and the TaN hardmask layer as shown in FIG. 2A along with the alignment problems between different metallization levels as shown in FIG. 2B, illustrates the unacceptability in the past of using TaN as the metal hardmask due to alignment difficulties.

Figure 3A:
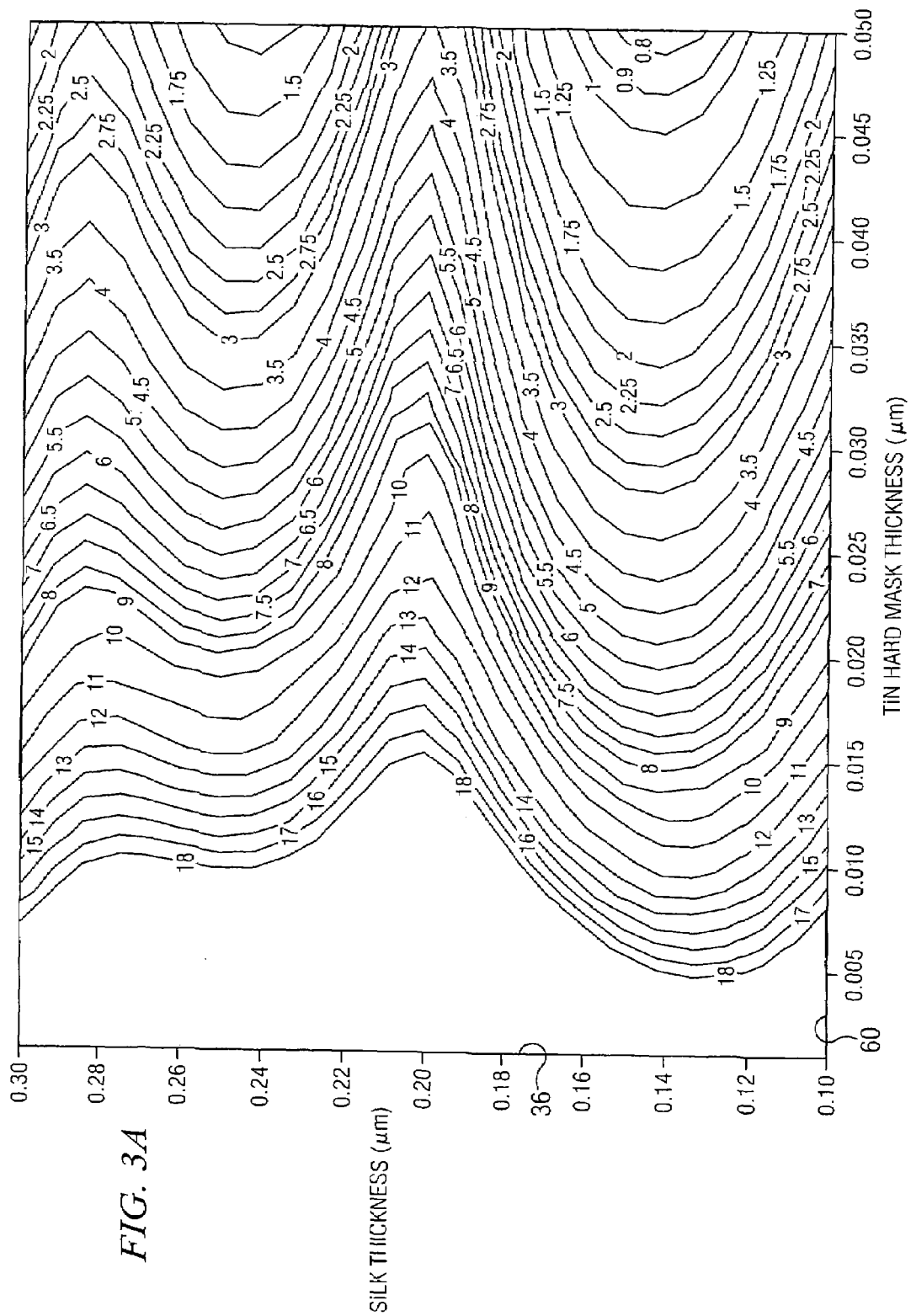
FIG. 3A is a diagram similar to that of FIG. 2A except TiN is used as the metal hardmask instead of TaN. As shown, there are no difficult alignment problems using TiN.
Figure 3B:
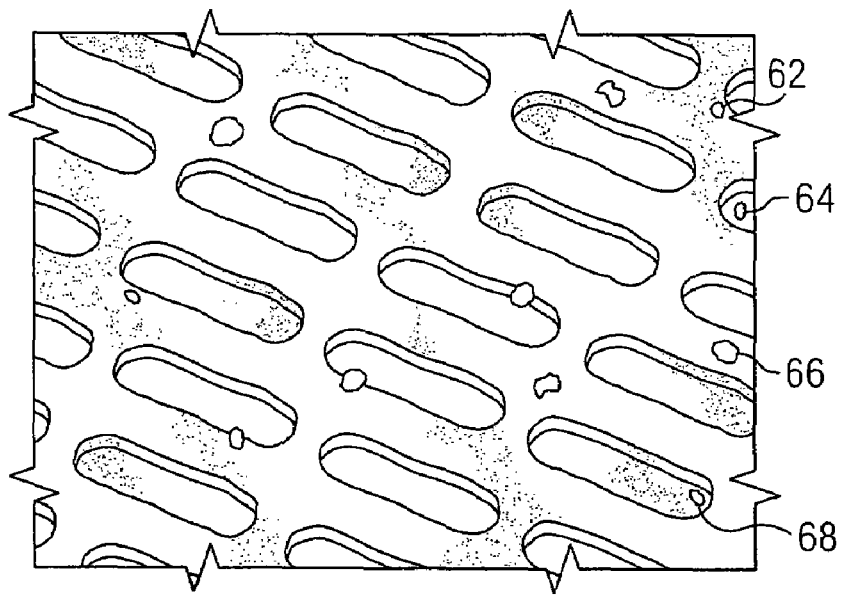
FIG. 3B represents an SEM (scanning electronic microscope) of etched vias and shows the many deposits of $TiO_x$, residue on the etched surfaces.

Referring now to FIG. 3A, there is shown a diagram similar to that shown in FIG. 2A and discussed above. However, instead of the horizontal axis representing the thickness of a hardmask made from a TaN layer, horizontal axis 60 represents the thickness of a hardmask made from TiN. From this diagram it is seen that for substantially all thicknesses of SiLK™ and TiN that might reasonably be used in a Dual Damascene process for the manufacture of semiconductor devices, alignment is sufficiently reliable to assure an acceptable or satisfactory WQ or wafer quality. Consequently, it would seem that a simple solution to the alignment problem that results with the use of a TaN layer as discussed above as a hardmask material is to simply use TiN. Unfortunately, although there are no alignment issues with TiN, the oxygen that is present during an RIE (reactive ion etch) leaves a residue or deposits of $TiO_2$ on the etched surfaces as indicated at 62, 64, 66 and 68 in FIG. 3B. The residue in turn results in an unacceptable high capacitance value and also introduces other reliability issues that render the use of TiN unacceptable.

Figure 4:
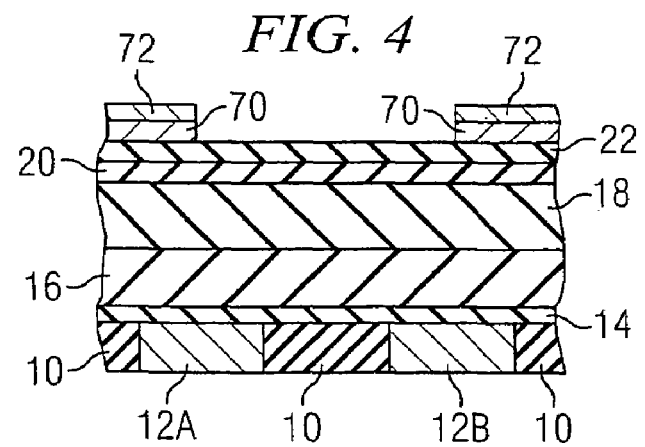
FIG. 4 illustrates the combined TiN/TaN metal hardmask of the present invention.

Referring now to FIG. 4, there is shown a dielectric stack and metal hardmask structure according to the present invention. As shown, the dielectric stack is similar to that of FIG. 1A and consequently the reference numbers for common elements or layers of the stack are the same. However, instead of a single layer metal hardmask 24 as shown in FIGS. 1A through 1H, a bilayer hardmask comprises a first or primary layer 70 of TiN having a thickness of between about 20 nm to 25 nm such as may be deposited by a standard process. The layer 70 of TiN is then covered by a capping layer 72 of TaN having a thickness of between about 7.5 nm to 10.0 nm deposited according to a standard PVD process.

Although the present invention and its advantages have been described in detail, it should be understood that various changes, substitutions and alterations can be made herein without departing from the spirit and scope of the invention as defined by the appended claims. For example, it will be readily understood by those skilled in the art that dimensions and layer thickness may be varied while remaining within the scope of the present invention.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. A method of providing a metal hardmask for patterning a dielectric stack comprising the steps of:
    depositing a first dielectxic layer and a second dielectric layer to form an unetched dielectric stack;
    depositing a layer of TiN (titanium nitride) over said dielectric stack;
    depositing a capping layer of TaN (tantalum nitride) over said layer of TiN; and
    etching both said layer of TiN and said capping layer of TaN according to a selected pattern to form a bilayer hardmask having said selected template pattern on said dielectric stack, such that both layers of said hardmask mask the same portions of said unetched dielectric stack.

2. The method of claim 1 wherein said step of depositing a first dielectric layer and depositing a second dielectric layer comprises the steps of depositing a first dielectric layer of SiO2 and a second dielectric layer of organic material.

3. The method of claim 1 further comprising the step of depositing at least one layer of etch, stop material selective to TaN and TIN over said dielectric stack before depositing said TaN and TiN layers.

4. The method of claim 3 wherein said step of depositing at least one layer of etch stop material comprises the steps of depositing a layer of a low dielectric copper barrier over said organic dielectric material and depositing a layer of SiN2 over said low dielectric copper barrier layer.

5. The method of claim 1 wherein said step of depositing a layer of TiN comprises depositing a layer of TiN having a thickness of between about 20 nm and about 25 nm.

6. The method of claim 5 wherein said step of depositing a capping layer of TaN comprises the step of depositing a layer of TaN having a thickness of between about 7.5 nm and about 10 nm.

7. The method of claim 1 further comprising the step of providing a first structure including at least one level of metallization and wherein said step of depositing a first dielectric layer comprises the step of depositing said first dielectric layer over said first structure.

8. The method of claim 7 wherein said step of providing comprises providing a first structure including at least one level of copper metallization.

* * * * *